(12) United States Patent
Motomura et al.

(10) Patent No.: US 9,839,143 B2
(45) Date of Patent: Dec. 5, 2017

(54) ELECTRODE JOINING METHOD, PRODUCTION METHOD OF ELECTRODE JOINED STRUCTURE

(71) Applicant: PANASONIC CORPORATION, Osaka (JP)

(72) Inventors: Koji Motomura, Osaka (JP); Hideki Eifuku, Osaka (JP); Hiroki Maruo, Osaka (JP); Tadahiko Sakai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 217 days.

(21) Appl. No.: 14/388,734

(22) PCT Filed: Mar. 15, 2013

(86) PCT No.: PCT/JP2013/001786
§ 371 (c)(1),
(2) Date: Sep. 26, 2014

(87) PCT Pub. No.: WO2013/153745
PCT Pub. Date: Oct. 17, 2013

(65) Prior Publication Data
US 2015/0047185 A1    Feb. 19, 2015

(30) Foreign Application Priority Data

Apr. 10, 2012 (JP) ................................ 2012-089587

(51) Int. Cl.
*H01R 12/62*  (2011.01)
*H05K 3/36*  (2006.01)
(Continued)

(52) U.S. Cl.
CPC ............ *H05K 3/363* (2013.01); *H05K 1/147* (2013.01); *H05K 3/3494* (2013.01); *H05K 3/361* (2013.01);
(Continued)

(58) Field of Classification Search
CPC ............................ H05K 3/361; H05K 3/3494
See application file for complete search history.

(56) References Cited

U.S. PATENT DOCUMENTS 5,164,336 A * 11/1992 Ohno ................. H01L 21/4853
228/180.22
6,462,284 B1 * 10/2002 Hashimoto ......... H01L 21/4853
174/259
(Continued)

FOREIGN PATENT DOCUMENTS

| JP | 63-305591 A | 12/1988 |
|---|---|---|
| JP | 3-30456 U | 3/1991 |
| JP | 7-26860 Y2 | 6/1995 |
| JP | 7-120849 B2 | 12/1995 |
| JP | 2004-327935 A | 11/2004 |
| JP | 2008-166488 A | 7/2008 |
| JP | 2008-198840 A | 8/2008 |
| WO | 2008/081969 A1 | 7/2008 |

OTHER PUBLICATIONS

International Search Report issued in International Application No. PCT/JP2013/001786 dated Apr. 23, 2013, with English Translation.

*Primary Examiner* — Minh Trinh
(74) *Attorney, Agent, or Firm* — McDermott Will & Emery LLP

(57) ABSTRACT

Disclosed is a system for mounting a flexible first substrate having a first connection region provided with a first electrode group, on a second substrate having a second connection region provided with a second electrode group. The system includes: a stage configured to support the second substrate; a unit for supplying a bonding material including conductive particles and a thermosetting resin, to at least one of the first and second electrode groups; a unit for placing the first substrate on the second substrate via the bonding material and a unit for successively performing a joining (Continued)

process by pressing a first electrode toward a second electrode and curing the thermosetting resin, using a heating tool, while moving the tool to a processing position of another first electrode not yet subjected to the joining process.

8 Claims, 7 Drawing Sheets

(51) Int. Cl.
  *H05K 3/34* (2006.01)
  *H05K 1/14* (2006.01)
  *H05K 3/32* (2006.01)
(52) U.S. Cl.
  CPC ..... *H05K 3/323* (2013.01); *H05K 2203/0195* (2013.01); *H05K 2203/0425* (2013.01); *H05K 2203/163* (2013.01); *Y10T 29/49126* (2015.01); *Y10T 29/53174* (2015.01)

(56) References Cited

U.S. PATENT DOCUMENTS

| | | | | |
|---|---|---|---|---|
| 8,328,066 B2* | 12/2012 | Fujita | ...................... | H01L 24/75 228/1.1 |
| 8,434,665 B2* | 5/2013 | Motomura | ............. | H05K 3/363 228/178 |
| 9,015,932 B2* | 4/2015 | Sakai | ................... | H01R 12/592 156/273.5 |
| 2004/0079464 A1* | 4/2004 | Kumakura | ............ | H01L 21/563 156/60 |
| 2004/0211057 A1 | 10/2004 | Totani et al. | | |
| 2005/0176310 A1* | 8/2005 | Kataoka | ................... | H01R 4/02 439/876 |
| 2009/0075025 A1* | 3/2009 | Ozono | ................... | H01L 24/29 428/120 |
| 2010/0018048 A1 | 1/2010 | Sakai et al. | | |

\* cited by examiner

ELECTRODE JOINING METHOD, PRODUCTION METHOD OF ELECTRODE JOINED STRUCTURE

RELATED APPLICATIONS

This application is a national phase of International Application No. PCT/JP2013/001786, filed on Mar. 15, 2013, which in turn claims the benefit of Japanese Application No. 2012-089587, filed on Apr. 10, 2012, the disclosures of which Applications are incorporated by reference herein.

TECHNICAL FIELD

The present invention relates to an improvement of a technique for connecting a flexible substrate to another substrate.

BACKGROUND ART

In recent years, there is an increasing demand for reduction in size and thickness of portable electronic equipment. To reduce the size or thickness of electronic equipment, it is effective to use a flexible substrate in the electronic equipment, so that the variation in component layout can be increased.

For example, by using a flexible substrate for an electronic module, increased variation in component layout can be realized, and simultaneously, the electrode (connection terminal) provided on the module substrate can be directly joined to the electrode (connection terminal) provided on the main circuit board or the like of the electronic equipment (see Patent Literature 1). The electronic module can thus be connected to the main circuit board without a conductor wire for connection, improving the space efficiency. Moreover, a broken wire and the like are unlikely to occur, improving the reliability in connection between the components.

In the case of directly joining the electrode on the module substrate to the electrode on the main circuit board as mentioned above, a reinforcement portion containing a thermosetting resin is typically formed around the junction where the electrodes are joined. Specifically, an uncured resin supplied between the module substrate and the main circuit board is heated via the module substrate or main circuit board and cured, thereby to form a resin reinforcement portion comprising cured resin.

Conventionally, in joining a plurality of electrodes of the electronic module to a plurality of electrodes of the main circuit board, a heating tool having a pressing surface whose area is equal to or larger than that of a connection region including those electrodes is used to join the electrodes to each other.

CITATION LIST

Patent Literature

[PTL 1] Japanese Laid-Open Patent Publication No. 2008-166488

SUMMARY OF INVENTION

Technical Problem

In the conventional method, however, since a comparatively large area is pressed and heated at the same time with one heating tool, the pressing force or the degree of heating may become non-uniform within the connection region. Therefore, some of the electrodes may fail to be joined securely, and the uncured resin may not be cured sufficiently at some places, where a resin reinforcement portion with sufficient strength is not formed. This reduces the reliability in connection between the substrates.

Particularly when a solder (particles) for joining electrodes is added to the uncured resin, and used to solder-join the electrodes and form resin reinforcement portions at the same time (see Patent Literature 1), fine adjustments to the pressing force and the heating temperature are required for forming a favorable solder joint between the electrodes. Therefore, particularly in such a case, the adverse effects due to non-uniform pressing and heating within the connection region become severe.

In view of the above, the present invention intends to provide an electrode joining method, a production method of an electrode joined structure, and a production system of an electrode joined structure that are effective to connect substrates to each other by joining a plurality of electrodes on one substrate to a plurality of electrodes on another substrate with a conductor that is to be melted and then solidified, and reinforcing the junctions with a resin. By connecting as above, the joint strength can be made uniform among all the junctions, and thus the reliability in connection between the substrates can be improved.

Solution to Problem

An aspect of the present invention relates to an electrode joining method including the steps of:

(i) feeding a flexible first substrate which has a first surface having a first connection region provided with a first electrode group including a plurality of first electrodes, and a second surface opposite to the first surface;

(ii) feeding a second substrate having a second connection region provided with a second electrode group including a plurality of second electrodes corresponding to the plurality of first electrodes;

(iii) supplying a bonding material including conductive particles and a thermosetting resin, to at least one of the first electrode group and the second electrode group;

(iv) bringing the first electrode group and the second electrode group to face each other via the bonding material, with the first electrode group and the second electrode group aligned with each other; and (v) performing a joining process using a heating tool to be abutted against a pressing region on the second surface corresponding to the first connection region.

The joining process includes pressing one or more first electrodes selected from the plurality of first electrodes toward one or more second electrodes corresponding to the one or more first electrodes, and heating the first electrodes and the second electrodes to a temperature at which the thermosetting resin cures.

The joining process is performed successively, while moving the tool from a processing position of the selected one or more first electrodes to a processing position of another one or more first electrodes that are not yet subjected to the joining process.

Another aspect of the present invention relates to a production method of an electrode joined structure, including the steps of:

(i) feeding a flexible first substrate which has a first surface having a first connection region provided with a first electrode group including a plurality of first electrodes, and a second surface opposite to the first surface;

(ii) feeding a second substrate having a second connection region provided with a second electrode group including a plurality of second electrodes corresponding to the plurality of first electrodes;

(iii) supplying a bonding material including conductive particles and a thermosetting resin, to at least one of the first electrode group and the second electrode group;

(iv) bringing the first electrode group and the second electrode group to face each other via the bonding material, with the first electrode group and the second electrode group aligned with each other; and (v) performing a joining process using a heating tool to be abutted against a pressing region on the second surface corresponding to the first connection region.

The joining process includes pressing one or more first electrodes selected from the plurality of first electrodes toward one or more second electrodes corresponding to the one or more first electrodes, and heating the first electrodes and the second electrodes to a temperature at which the thermosetting resin cures.

The joining process is performed successively, while moving the tool from a processing position of the selected one or more first electrodes to a processing position of another one or more first electrodes that are not yet subjected to the joining process.

Yet another aspect of the present invention relates to a system of producing an electrode joined structure by mounting a flexible first substrate on a second substrate.

The first substrate has a first surface having a first connection region provided with a first electrode group including a plurality of first electrodes, and a second surface opposite to the first surface.

The second substrate has a second connection region provided with a second electrode group including a plurality of second electrodes corresponding to the plurality of first electrodes.

The system includes:

a stage configured to support the second substrate;

a bonding material supplying unit for supplying a bonding material including conductive particles and a thermosetting resin, to at least one of the first electrode group and the second electrode group;

a placing unit for placing the first substrate on the second substrate supported on the stage, to bring the first electrode group and the second electrode group to face each other via the bonding material, with the first electrode group and the second electrode group aligned with each other; and a joining unit including a heating tool to be abutted against a pressing region of the second surface corresponding to the first connection region, and being configured to perform a joining process using the heating tool.

The joining process includes pressing one or more first electrodes selected from the plurality of first electrodes toward one or more second electrodes corresponding to the one or more first electrodes, and heating the first electrodes and the second electrodes to a temperature at which the thermosetting resin cures.

The joining process is performed successively, while moving the tool from a processing position of the selected one or more first electrodes to a processing position of another one or more first electrodes that are not yet subjected to the joining process.

According to the production method or production system of an electrode joined structure of the present invention, it is possible to provide an electrode joined structure including a flexible first substrate having a first connection region provided with a first electrode group, a second substrate having a second connection region provided with a second electrode group corresponding to the first electrode group, and a solder joint electrically connecting the first connection region to the second connection region.

The solder joint includes a resin portion and metal portions dispersed in the resin portion.

The metal portions each have a flat shape having major diameter a and minor diameter b orthogonal to each other, and the major diameters are unidirectionally oriented.

Advantageous Effects of Invention

According to the present invention, when joining the first electrode group on the first substrate to the second electrode group on the second substrate, with a bonding material including conductive particles and a thermosetting resin, variations in load are unlikely to occur, and almost the same pressure can be applied to each pair of the first and second electrodes facing each other. Therefore, the reliability in connection between the substrates can be improved.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
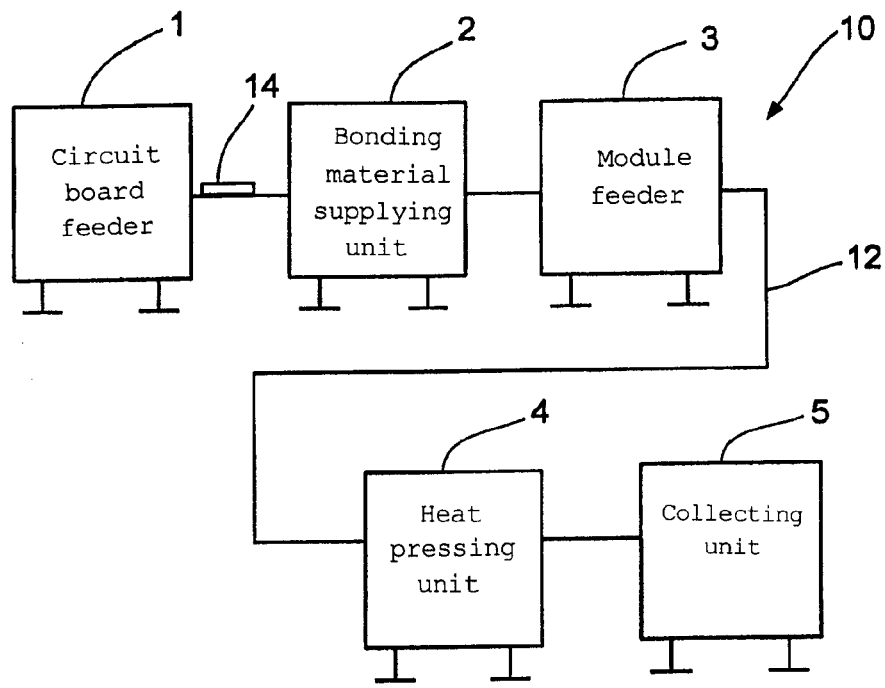
FIG. 1 A block diagram of a production line representing a production system of an electrode joined structure according to one embodiment of the present invention FIG. 2 A top view schematically illustrating a main circuit board (motherboard) of electronic equipment, as one example of a second substrate FIG. 3 A top view schematically illustrating a module substrate of an electronic module, as one example of a first substrate FIG. 4 A top view of a connection region of the main circuit board with a bonding material supplied on the connection region FIG. 5 A top view illustrating a layout of components in the interior of a heat pressing unit FIG. 6 A front view illustrating the layout of components in the interior of the heat pressing unit FIG. 7 A front view detailing a tool head FIG. 8 A partial cross-sectional view of a portion subjected to a heat pressing process, immediately before the start of processing FIG. 9 A partial cross-sectional view of the portion subjected to the heat pressing process, immediately after the start of processing FIG. 10 A partial cross-sectional view of the portion subjected to the heat pressing process, when part of the processing is completed FIG. 11 A partial cross-sectional view of the portion subjected to the heat pressing process, when the processing is nearly completed FIG. 12 A top view schematically illustrating the shape of solid solder formed through the heat pressing process FIG. 13 A front view detailing a tool head used in a production system of an electrode joined structure according to another embodiment of the present invention FIG. 14 A front view detailing a tool head used in a production system of an electrode joined structure according to yet another embodiment of the present invention FIG. 15 A front view detailing a tool head used in a production system of an electrode joined structure according to still another embodiment of the present invention FIG. 16 An enlarged partial cross-sectional view of a portion subjected to a heat pressing process according to a conventional electrode joining method FIG. 17 An enlarged partial cross-sectional view of the portion subjected to the heat pressing process, for explaining a problem associated with the conventional electrode joining method

The electrode joining method of the present invention includes the steps of: (i) feeding a flexible first substrate which has a first surface having a first connection region provided with a first electrode group including a plurality of first electrodes, and a second surface opposite to the first surface; (ii) feeding a second substrate having a second connection region provided with a second electrode group including a plurality of second electrodes corresponding to the plurality of first electrodes; (iii) supplying a bonding material including conductive particles and a thermosetting resin, to at least one of the first electrode group and the second electrode group; and (iv) bringing the first electrode group and the second electrode group to face each other via the bonding material, with the first electrode group and the second electrode group aligned with each other.

In joining the electrodes of circuit members according to the present invention, (v) a heating tool to be abutted against a pressing region of the second surface corresponding to the first connection region is used. Specifically, a joining process is performed using the tool, by pressing one or more first electrodes toward the corresponding one or more second electrodes and heating the first and second electrodes to a temperature at which the thermosetting resin cures. The joining process is performed successively by moving the tool from a processing position of the above one or more first electrodes to a processing position of another one or more first electrodes that are not yet subjected to the joining process.

Examples of the conductive particles include, but not limited to, solder particles, nickel particles, and gold-plated resin particles. Among them, solder particles are preferred in that they can ensure the electrical connection between the electrodes even though the thermosetting resin is not cured sufficiently. In the case of using solder particles, in the joining process, the first and second electrodes are heated to a melting temperature of the solder particles while the first electrodes are pressed toward the second electrodes, and thus molten solder spreads between the electrodes, forming a solder joint. Therefore, as compared with using other conductive particles such as nickel particles and gold-plated particles, the electrical connection between the electrodes becomes more reliable.

The present invention will be described below, with reference to an exemplary case where an electronic module including a flexible substrate (an example of the first substrate: module substrate) is mounted onto a main circuit board (an example of the second substrate: motherboard) for various electronic equipment. In this case, a plurality of module electrodes are arranged all together within one region (the first connection region) on one surface (the first surface) of the module substrate. Likewise, on the main circuit board, a plurality of electrodes (hereinafter referred to as "circuit-board electrodes") corresponding to the module electrodes are arranged all together within one connection region (the second connection region).

The connection regions of the module substrate and the main circuit board are brought to face each other, and a bonding material is supplied between the two. The bonding material includes solder particles (an example of the conductive particles) for joining electrodes and an uncured thermosetting resin (hereinafter sometimes referred to as "uncured resin").

Figure 16:
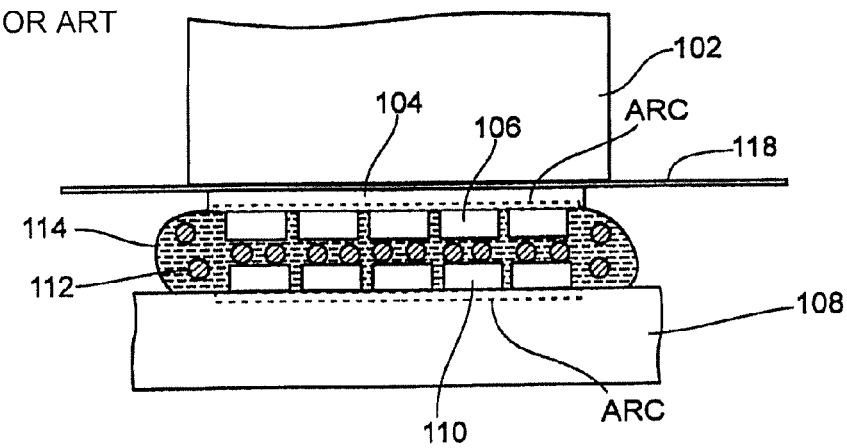

Conventionally, as illustrated in FIG. 16, a heating tool 102 having a pressing surface larger than each connection region ARC is used to press and heat the entire connection region ARC at one time from above a module substrate 104. As a result, all module electrodes 106 within the connection region ARC and all circuit-board electrodes 110 on a main circuit board 108 are simultaneously joined to each other with molten matter of solder particles 112. At this time, an uncured resin 114 is heated and cured at one time in the entire connection region ARC, thereby to form a resin reinforcement portion. Such processing is hereinafter sometimes referred to as "heat pressing". Here, various adverse effects occur if, for example, the thickness of the module substrate 104 is uneven, the heights of the module electrodes 106 are non-uniform, or, as illustrated in FIG. 17, the pressing surface of the heating tool 102 is inclined due to a large load.

Figure 17:
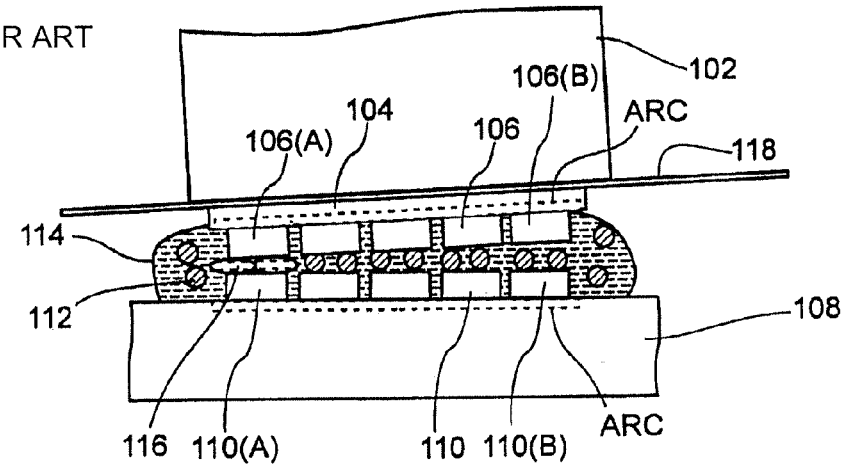

For example, as illustrated in FIG. 17, at some electrodes 106(A) and 110(A), the pressing force applied thereto becomes too large, forcing the uncured resin 114 out of the connection regions ARC, or causing an excessive flow or wide spread of the molten solder 116. The excessive flow of the molten solder 116 may possibly cause a failure of electrical connection between electrodes. Moreover, the pressing and heating to the solder become insufficient between some other electrodes 106(B) and 110(B), causing an insufficient electrical connection between electrodes or failure of formation of a solder joint with sufficient strength. Due to the foregoing, the reliability in connection between the substrates is reduced.

Furthermore, when the substrate is, for example, an organic substrate, it may contain a volatile component. If not organic, the substrate may contain water absorbed during storage or transportation. Under such circumstances, if the entire connection region is heated by the heating tool having a pressing surface with a comparatively large area, a larger amount of gas or vapor is generated, and the uncured resin spreading over a comparatively large area is cured at a time. Therefore, the gas generated in a large amount tends to remain as voids in the cured resin, without being released outside.

In contrast, according to the present invention, in which a heating tool having a pressing surface with a comparatively small area is used, and, representatively, a pair of electrodes and its vicinity only are pressed, variations in load are unlikely to occur. Therefore, almost the same pressure can be applied to each pair of the module electrode 106 and the circuit-board electrode 110 facing each other, and the pressure applied to the solder is prevented from becoming excessive or insufficient at some pairs of electrodes. Moreover, since the connection region is heated only for a comparatively short time, the amount of generated gas is small even if the substrate contains absorbed water or volatile components. Therefore, voids are unlikely to be produced. Furthermore, since the uncured resin within a comparatively small area cures temporarily, the generated gas can easily escape outside. Therefore, voids are further unlikely to be produced. As a result, the strength of the resin reinforcement portion, and thus the reliability in connection between the substrates can be improved.

Conventionally, due to the requirement for reduction in size of the equipment, as illustrated in FIGS. 16 and 17, the outer periphery of the connection region ARC of the module substrate is nearly overlapped with that of the module substrate itself in many cases. In other words, the electrodes are provided closely to the side ends of the module substrate in many cases. In such a case, the resin forced out from, for example, the edge of the module substrate might attach to the pressing surface of the heating tool. To prevent this, it is necessary, for example, to apply a Teflon (registered trademark) sheet 118 on the module substrate, and push the pressing surface of the heating tool 102 onto the sheet. This has been increased the number of production processes, and increased labor and costs for replacement, because the deterioration of the Teflon (registered trademark) sheet is fast due to pressing and heating.

In contrast, according to the present invention, in which a heating tool having a pressing surface with a comparatively small area is used, and, representatively, a pair of electrodes is pressed with a small pressing force, the uncured resin is unlikely to be forced out from the edge of the module substrate and other portions, and in addition, the pressing surface of the heating tool, above the module substrate, is unlikely to protrude from the module substrate. Therefore, there is no need to apply a sheet as mentioned above on the module substrate, and the number of processes and costs can be reduced.

Moreover, since the area of the pressing surface of the heating tool is small, the load applied by the heating tool to the module substrate can be reduced. For example, when other electronic components are arranged inside or on the back side of the main circuit board at a region corresponding to the connection region of the circuit board, the load applied to those components can be reduced. It is therefore possible to prevent the damage by heat pressing, to the electronic components, especially to other electronic components provided in or on the main circuit board. For example, according to the present invention, the area of the pressing surface of the heating tool can be easily reduced to as small as ⅛ to 1/10 of that in Patent Literature 1, and accordingly, the load applied to the module substrate and the main circuit board by the heating tool can be easily reduced to ⅛ to 1/10. Consequently, the load applied to the electronic component provided at a region corresponding to the connection region can be reduced to, for example, ⅛ to 1/10. In addition, it becomes possible to provide an electronic component in a region on the circuit board where providing an electronic component is considered impossible because of a large load applied thereto during heat pressing. This increases the design variation, and allows more effective space utilization on the circuit board. Therefore, the electronic equipment can be further easily reduced in size.

Furthermore, since heat pressing is performed by pushing the heating tool against the pressing surface of a flexible module substrate, the flexible module substrate can be made more flexible by heating. Since the module substrate can readily deform as the heating tool moves, it is not necessary to increase the area of the facing surface in order for each pair of electrodes to properly face each other, and thus the distance between the electrodes can be reduced. Therefore, the electronic component can be easily reduced in size.

In the electrode joining method of the present invention, the pressing force applied by the heating tool to the pressing region is preferably consistent during the above step (v). By successively joining one or more first electrodes and one or more second electrodes corresponding thereto to each other, while pressing them with a consistent force, the joint strength can be made uniform among the junctions. This improves the joint reliability. Moreover, since the degree of curing of the cured resin around each junction is also made uniform, the strength of the joint reinforcement portion, too, is made uniform. This can further improve the joint reliability. In view of minimizing the area of the pressing surface of the heating tool, it is preferable to join a pair of the first and second electrodes, one by one, and preferably, to join up to 20 pairs at one time, desirably up to about 10 pairs at one time. Conventionally, more than 20 pairs of electrodes have been often joined at one time with one heating tool, although depending on the equipment to be used. As compared therewith, the load applied by the heating tool can be reduced to one severalth, even though 20 pairs of first and second electrodes are joined at one time.

By moving the tool at a constant speed, junctions with more uniform strength can be formed, and the degree of curing of the resin in the resin reinforcement portion can be made more uniform within the connection region. This can further improve the joint reliability. The tool is typically moved linearly. In the case where the electrodes are arranged in zigzag or the like, however, the tool may be moved in a zigzag manner accordingly. Likewise, depending on the layout of the electrodes, the tool may be moved so as to draw a circle or other trajectories.

The bonding material is preferably supplied in the form of film between the electrodes. By supplying in the form of film, the bonding material can be supplied with a simple work. As a result, a machine with simpler structure can be used to supply the bonding material, leading to a cost reduction. In addition, the production tact time can be easily shortened. Furthermore, as compared with supplying a bonding material by application for example, the thickness of the bonding material can be easily made uniform within the connection region. This can make the strength of the resin reinforcement portion uniform within the connection region, which can improve the reliability in connection between the substrates. Moreover, the bonding material in the form of film is typically more viscous than the bonding material in the form of paste to be supplied by application. Therefore, the connection regions of the first and second substrates are fixedly held in advance with a certain degree of strength. As a result, the first and second substrates become unlikely to be displaced from each other while the heating tool is moved.

The production method of an electrode joined structure of the present invention includes the steps of: (i) feeding a flexible first substrate which has a first surface having a first connection region provided with a first electrode group including a plurality of first electrodes, and a second surface opposite to the first surface; (ii) feeding a second substrate having a second connection region provided with a second electrode group including a plurality of second electrodes corresponding to the plurality of first electrodes; (iii) supplying a bonding material including conductive particles and a thermosetting resin, to at least one of the first electrode group and the second electrode group; and (iv) bringing the first electrode group and the second electrode group to face each other via the bonding material, with the first electrode group and the second electrode group aligned with each other.

The above production method further includes the step (v) performing a joining process using a heating tool to be abutted against a pressing region of the second surface corresponding to the first connection region. Using the heating tool, one or more first electrodes are pressed toward the corresponding one or more second electrodes, and the first electrodes and the second electrodes are heated to a temperature at which the thermosetting resin cures. The joining process is performed successively, while moving the tool from a processing position of the one or more first electrodes to a processing position of another one or more first electrodes that are not yet subjected to the joining process.

The production system of an electrode joined structure of the present invention relates to a system of producing an electrode joined structure by mounting a flexible first substrate on a second substrate. In this case also, the first substrate has a first surface having a first connection region provided with a first electrode group including a plurality of first electrodes, and a second surface opposite to the first surface. The second substrate has a second connection region provided with a second electrode group including a plurality of second electrodes corresponding to the plurality of first electrodes. The system includes: a stage configured to support the second substrate; a bonding material supplying unit for supplying a bonding material including conductive particles and a thermosetting resin, to at least one of the first electrode group and the second electrode group; and a placing unit for placing the first substrate on the second substrate supported on the stage, such that the first electrode group faces the second electrode group via the bonding material, with the first electrode group and the second electrode group aligned with each other.

The above system further includes a joining unit including a heating tool to be abutted against a pressing region of the second surface corresponding to the first connection region. A joining process is performed using the heating tool, by pressing one or more first electrodes toward the corresponding one or more second electrodes, and heating the first electrodes and the second electrodes to a temperature at which the thermosetting resin cures. The joining process is performed successively, while moving the tool from a processing position of the one or more first electrodes to a processing position of another one or more first electrodes that are not yet subjected to the joining process.

Here, an abutting portion of the tool to be abutted against the pressing region is preferably chamfered. This allows the tool to be smoothly moved while being abutted against the pressing region with a consistent pressing force, without damaging the first substrate. In that way, the movement of the tool at a constant speed, as well as the pressing with a consistent force can be easily realized. Therefore, the reliability in connection between the substrates can be easily improved. Moreover, the friction between the tool and the pressing region is reduced. This can effectively prevent a positional displacement between the first and second electrodes resulted from stretching of the flexible first substrate due to friction.

For smooth movement of the tool, it is also preferable that the abutting portion of the tool to be abutted against the pressing region is provided with a rotatable member.

Furthermore, in the production system of an electrode joined structure of the present invention, the abutting portion of the tool to be abutted against the pressing region may include a high-temperature portion having a first temperature, and a low-temperature portion having a second temperature lower than the first temperature. The high-temperature portion and the low-temperature portion are adjacent to each other with a heat insulator interposed therebetween (see FIG. 13). The low-temperature portion is positioned ahead of the high-temperature portion in the moving direction of the tool. By doing so, the pressing region is pressed in advance with the low-temperature portion, and then heated while pressed with the high-temperature portion. As a result, with the low-temperature portion, solder particles can be more effectively captured between the electrodes facing each other; with the high-temperature portion, the solder particles can be heated while sufficient pressing force is applied thereto, and thus a joint with sufficient strength can be formed. Furthermore, even when an acrylic resin which cures very quickly is used as the uncured resin, sufficient pressing force can be applied to the solder particles contained in the uncured resin, without obstructed by the curing of the resin. By using a resin which cures very quickly, the resin reinforcement portion can be formed more rapidly, and the productivity can be significantly improved.

In another embodiment of the above production system, the tool may include an axial member having at one end the abutting portion to be abutted against the pressing region. The axial member is preferably inclined from a direction normal to the pressing region, such that the other end of the axial member is ahead of the abutting portion in the moving direction of the tool (see FIG. 14). By doing so, the uncured resin can be heated in advance with the other end of the axial member, before it is pressed. As a result, even when using a resin which cures slowly but has good properties after cured, for example, epoxy resin, phenol resin, and urethane resin, the resin reinforcement portion can be formed more rapidly. This achieves good reliability in connection between the substrates, as well as good productivity.

The joining unit preferably includes a pressing force stabilizing mechanism to make consistent a pressing force applied by the tool to the pressing region. The pressing force stabilizing mechanism includes: an actuator configured to generate pressing force; a sensor for sensing pressing force; and a feedback controller configured to control the actuator based on a value sensed by the sensor.

The above production method can be suitably applied to the case where the first substrate is a substrate of an electronic module, and the second substrate is a main circuit board or motherboard of various electronic equipment.

According to the above production method or production system, it is possible to efficiently provide an electrode joined structure with high connection reliability. The electrode joined structure includes: a flexible first substrate having a first connection region provided with a first electrode group; a second substrate having a second connection region provided with a second electrode group corresponding to the first electrode group; and a junction comprising conducive particles (e.g., a solder joint) that electrically connects the first connection region to the second connection region. For example, when the first substrate is included in an electronic module, and the second substrate is included in a motherboard, an electronic module-attached motherboard with high connection reliability can be obtained. The solder joint of the obtained electrode joined structure includes a resin portion (resin reinforcement portion) and metal portions dispersed in the resin portion. The metal portions each have a flat shape having major diameter a and minor diameter b orthogonal to each other, and the major diameters are unidirectionally oriented.

The reason why the metal portions having the above shape can be obtained is as follows. A joining process in which a first electrode is heated while pressed toward the corresponding second electrode is performed successively by moving the heating tool from a first processing position of the first electrode to a processing position of another first electrode that is not yet subjected to the joining process. In the joining process, as the heating tool moves, the molten solder is stretched within the thermosetting resin in the direction parallel to the moving direction of the heating tool. Thereafter, the shape of the cured solid solder (i.e., metal portion) parallel to the substrate surface becomes flat, stretched in the plane direction of the first and second substrates, and long and narrow (e.g. oblong) with major diameter a and minor diameter b.

As illustrated in FIG. 16, in the case of pressing the entire connection region ARC at one time with the heating tool 102 having a pressing surface larger than each connection region ARC, the shape of each metal portion in the solder joint is circular when viewed from the pressing face. The circular metal portions tend to form dot-like joints between the electrodes, which restricts the increase in the joint strength between the electrodes. On the other hand, the long and narrow metal portions each having major diameter a and minor diameter b can form belt-like joints between the electrodes, which is advantageous in enhancing the joint strength between the electrodes. Moreover, this provides a structure which is very strong against the tensile stress or contraction stress applied in the direction parallel to major diameter a.

Here, the ratio: a/b of major diameter a to minor diameter b of the metal portion is preferably 1.2 to 10, and more preferably 1.5 to 7, and yet more preferably 1.5 to 5. Setting the a/b ratio to 1.2 or higher can more effectively enhance the joint strength between the electrodes. This can sufficiently increase the resistance to the tensile stress or contraction stress applied in the direction parallel to major diameter a. To set the a/b ratio higher, however, it is necessary to increase the moving speed of the heating tool during the joining process. When the moving seed of the heating tool is too fast, the bonding material tends to be forced out of the connection area ARC. Therefore, the a/b ratio is preferably set to 10 or less.

In a preferred embodiment of the electrode joined structure, the plurality of first electrodes constituting the first electrode group are each arranged linearly (e.g., in stripes) and parallel to each other within the first connection region. Likewise, the plurality of second electrodes constituting the second electrode group are each arranged linearly and parallel to each other within the second connection region. The longitudinal directions of the first electrodes are parallel to those of the second electrodes. The absolute value of an angle formed by the orientation direction of major diameters a of the metal portions in the solder joint and the longitudinal directions of the first electrodes and the second electrodes is 60 to 90°. In such a structure, the longitudinal directions of the first and second electrodes intersect with major diameters a of the metal portions at a large angle, increasing the contact area between each electrode and the metal portions, which thus increases the peeling strength.

In the solder joint, the ratio of the resin portion to the total of the resin portion and the metal portions is preferably 80 to 99.8 vol %, and more preferably 90 to 99.5 vol %. Controlling the volume ratio of the metal portions within the range above can prevent a short-circuit between the adjacent first electrodes or between the adjacent second electrodes, as well as can form a highly reliable solder joint.

Embodiments of the present invention will now be described, with reference to the drawings.

Embodiment 1

FIG. 1 is a block diagram of a production line as an example of a production system of an electrode joined structure according to one embodiment of the present invention.

A production line 10 illustrated in the figure is for mounting an electronic module such as a liquid crystal display module on a main circuit board of portable electronic equipment. The line 10 includes a circuit board feeder 1 for feeding a main circuit board, and a bonding material supplying unit 2 for supplying a bonding material onto the main circuit board. The main circuit board fed from the circuit board feeder 1 is placed on a stage 14 carried on a conveyor 12.

The line 10 further includes a module feeder 3 for feeding an electronic module including a first substrate onto the line. The electronic module fed from the module feeder 3 is placed on the stage 14 in a predetermined positional relationship with respect to the main circuit board on which the bonding material is supplied. More specifically, with aligning a second electrode group (circuit-board electrodes) on the main circuit board (second substrate) with a first electrode group (module electrodes) on the electronic module, the electronic module is fed to bring the first electrode group and the second electrode group to face each other via the boding material. The line 10 further includes a heat pressing unit 4 for connecting the main circuit board with the module substrate via the bonding material, and a collecting unit 5 for collecting an electrode joined structure (electronic module-attached substrate) formed by the connection.

Figure 2:
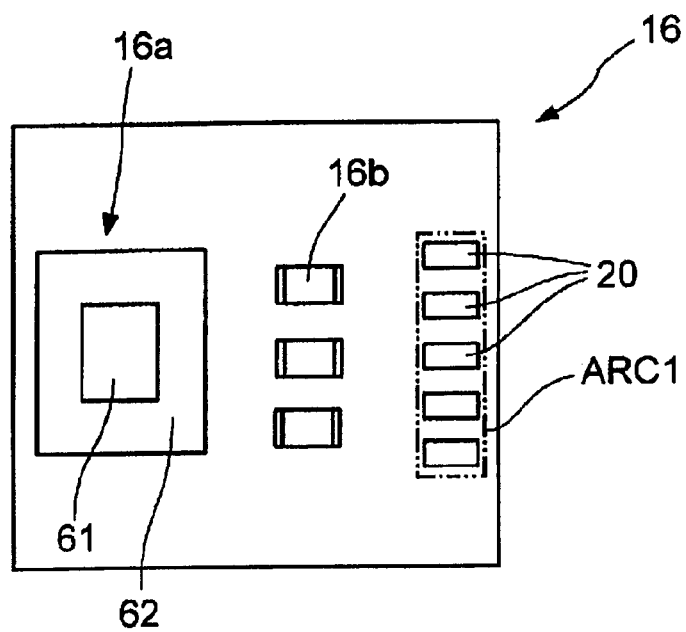
Figure 3:
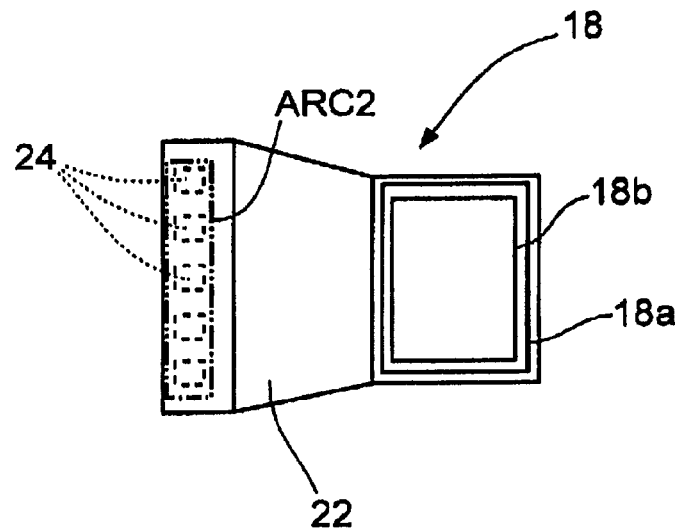

FIGS. 2 and 3 illustrate examples of the first substrate and the second substrate, respectively.

As illustrated in FIG. 2, various electronic components such as a CPU 16a and a condenser 16b are mounted on a main circuit board 16 which is an example of the second substrate. The CPU 16a includes a semiconductor device 61 and a semiconductor device-mounted substrate 62. In a portion near one side of the main circuit board 16 (near the right-handed end in the figure), a connection region ACR1 including a plurality of (five in the figure) circuit-board electrodes 20 (second electrode group) is formed. A wiring 16c (see FIG. 4) is connected to each of the circuit-board electrodes 20 within the connection region ARC1. Note that, in FIG. 2, the wiring (e.g., wiring 16c in FIG. 4) provided on the component-mounting surface of the main circuit board 16 (the front side of the sheet of drawing) are not shown.

On the other hand, as illustrated in FIG. 3, an electronic module 18 structured as a liquid crystal display module includes a module substrate 22 which is an example of the first substrate, a liquid crystal driver 18a mounted on the module substrate 22, and a liquid crystal panel 18b. In a portion near one side of the module substrate 22 (near the left-handed end in the figure), a connection region ARC2 including a plurality of (five in the figure) module electrodes 24 (first electrode group) is provided.

Next, referring to FIG. 4, the step of supplying a bonding material onto the connection region of the second substrate with the bonding material supplying unit 3 will be described.

Figure 4:
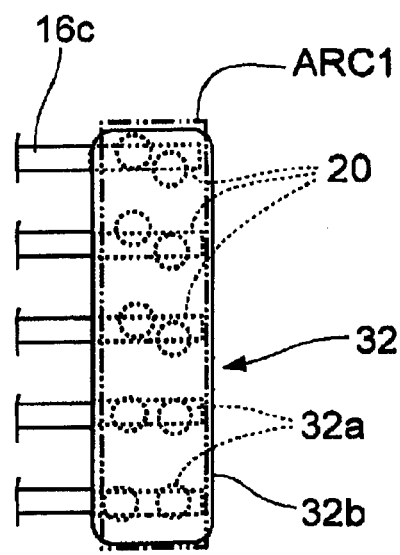

FIG. 4 is an enlarged top view of the connection region of the main circuit board of FIG. 2 and area around it. In FIG. 4, the main circuit board 16 itself is not shown. In the illustrated example, a bonding material 32 in the form of film cut in a predetermined shape (e.g., rectangular shape) is placed on the main circuit board 16 so as to overlap the connection region ARC1. The boding material 32 in the form of film can be placed on the connection region ARC1 using, for example, a vertically movable suction nozzle which is freely transferable above the main circuit board 16.

The bonding material 32 in the form of film can be obtained by kneading solder particles 32a serving as conductive particles, together with an uncured thermosetting resin 32b, to prepare a mixture, and forming the mixture into film. The bonding material 32 functions as an anisotropic conductive adhesive. More specifically, it imparts conductivity to the electrodes facing each other along the direction in which the pressure is applied, but does not impart conductivity along the direction perpendicular to the direction in which the pressure is applied. The bonding material can be supplied in any form without limited to using the bonding material 32 in the form of film. The bonding material may be in the form of paste. In this case, the bonding material can be supplied to each circuit-board electrode 20 by applying the paste to the connection region ARC1 using, for example, a dispenser.

Non-limiting examples of the thermosetting resin include epoxy resin, phenol resin, melamine resin, and urethane resin. The thermosetting resin may include a curing agent, a curing accelerator, and the like. Preferable examples of the curing agent include acid anhydride, aliphatic or aromatic amine, and imidazole or derivatives thereof. Examples of the curing accelerator include dicyandiamide. The thermosetting resin may further include a reactive diluent, carbon black, and a filler such as inorganic ceramics particles. The viscosity of the thermosetting resin may be controlled by, for example, changing the amount of reactive diluent or inorganic ceramic particles. The thermosetting resin may include other components such as an activator to be added to flux. By doing this, even though the thermosetting resin intrudes between the electrodes of the circuit members, the wettability of the electrodes with the molten solder can be more reliably ensured.

Examples of the solder include Sn—Bi alloy, Sn—Ag—Cu alloy, Sn—Bi—Ag alloy, Sn—Cu alloy, Sn—Sb alloy, Sn—Ag alloy, Sn—Ag—Cu—Bi alloy, Sn—Ag—Bi—In alloy, Sn—Ag—Cu—Sb alloy, Sn—Zn alloy, and Sn—Zn—Bi alloy, but not limited thereto. An example other than the above-exemplified Sn-based solders is gold solder.

Figure 5:
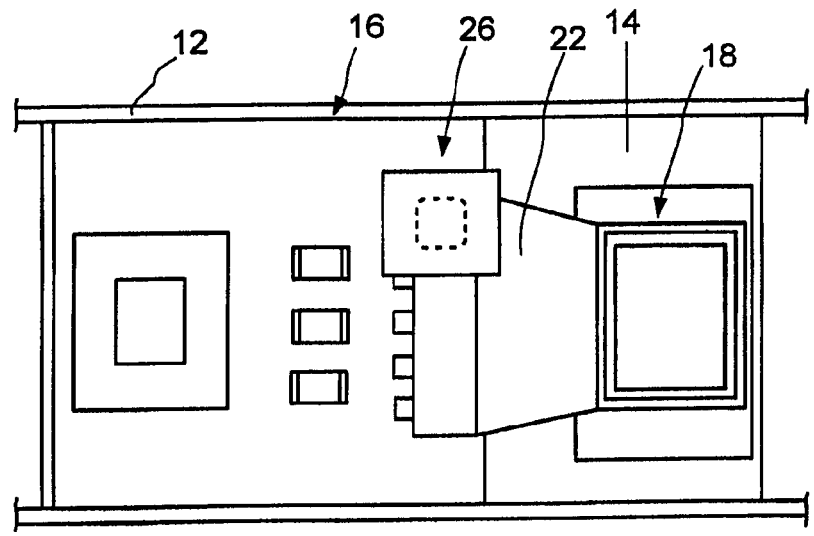
Figure 6:
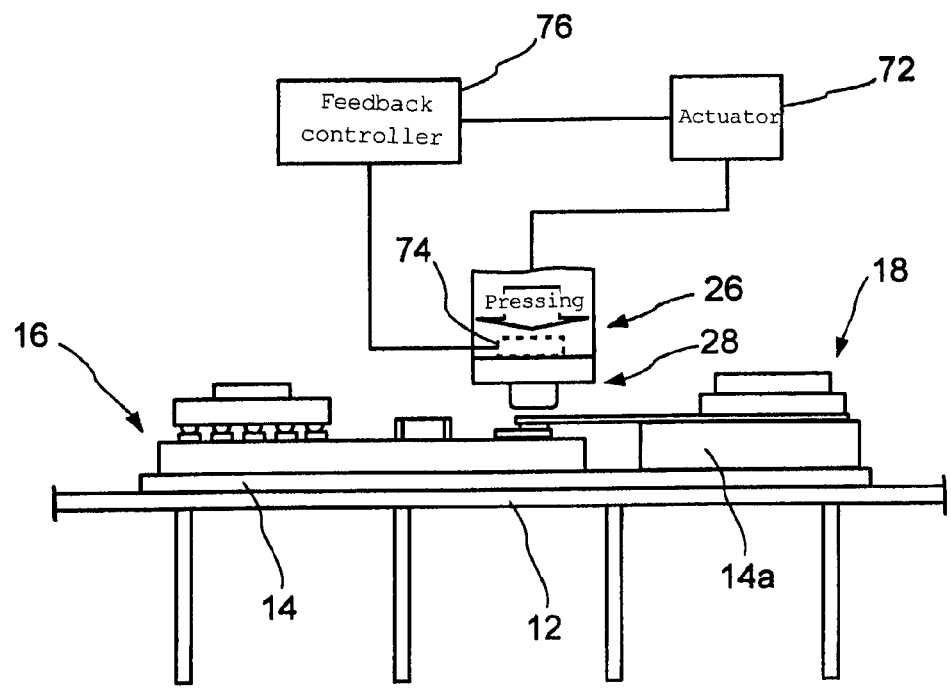

The inner structure of a heat pressing unit is illustrated in FIGS. 5 and 6.

FIG. 5 is a top view illustrating the state in which the main circuit board 16 supported on the stage 14 and the electronic module 18 are carried on the conveyor 12 into the heat pressing unit 4. FIG. 6 is a front view illustrating the state.

As illustrated in FIGS. 5 and 6, a heating tool 26 is provided in the interior of the heat pressing unit 4. A tool head 28 is attached onto the bottom end of the heating tool 26. Pressing force generated by an actuator 72 is transmitted to the heating tool 26. The actuator 72 may be, for example, an air cylinder, a hydraulic cylinder, or a motor. For example, using an air or hydraulic cylinder as the actuator can easily make consistent the pressing force applied by the heating tool 26 to the pressing surface. When using a motor as the actuator, the pressing force can be easily made consistent by providing a pressing force sensor 74 at the tip end (lower end) of the heating tool 26 where the tool head 28 is attached, and inputting the value detected by the sensor into a feedback controller 76, to feedback-control the pressing force.

As the feedback controller 76, a personal computer or the like can be handily used, by utilizing a design tool of a compensator for feedback control (e.g., program available from The MathWorks, Inc.).

Figure 7:
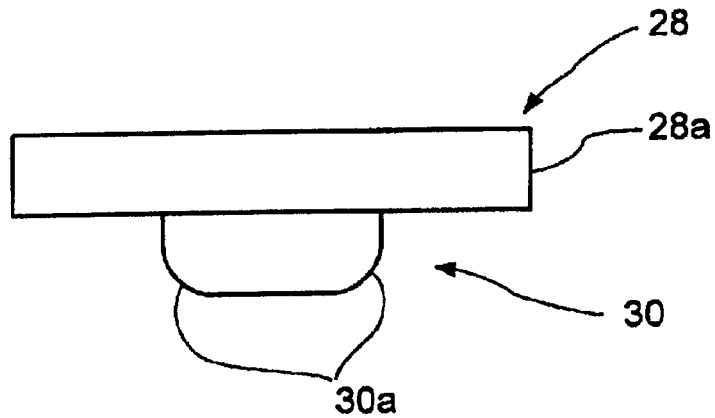

FIG. 7 is an enlarged view of a tool head. The tool head 28 includes a base block 28a and an abutting portion 30. The abutting portion 30 includes a chamfered portion 30a at its corner. This prevents the damage to the module substrate 22 by the abutting portion 30. Furthermore, this allows the heating tool to move smoothly, while the abutting portion 30 is abutted against the module substrate 22 with a consistent pressing force. In that way, the movement of the heating tool at a constant speed, as well as pressing with a consistent force can be easily realized. Therefore, the reliability in connection between the substrates can be easily improved.

Next, referring to FIGS. 8 to 10, the step of forming a solder joint between the electrodes using the heating tool will be described. The solder joint has a resin portion (resin reinforcement portion) and metal portions dispersed in the resin portion. Note that in these figures, only the tool head of the heat pressing unit is shown, and the main body of the heating tool is not shown.

Figure 8:
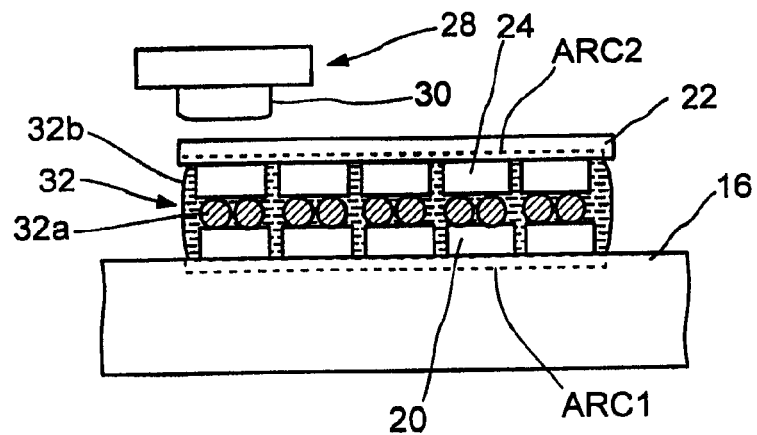

In FIG. 8, the circuit-board electrodes 20 within the connection region ARC1 and the module electrodes 24 within the connection region ARC2 are arranged to face each other. In this stage of processing, the head 28 is positioned above one or more first electrodes selected from the plurality of module electrodes 24 being the first electrode group. This is a first processing position of the joining process. Preferably, the abutting portion 30 of the tool head 28 is heated to a specific temperature (e.g., 150 to 250°) at the start of the joining process. By doing so, even at the first processing position, the thermosetting resin can be cured sufficiently, and the solder particles 32a can be melted quickly.

Figure 9:
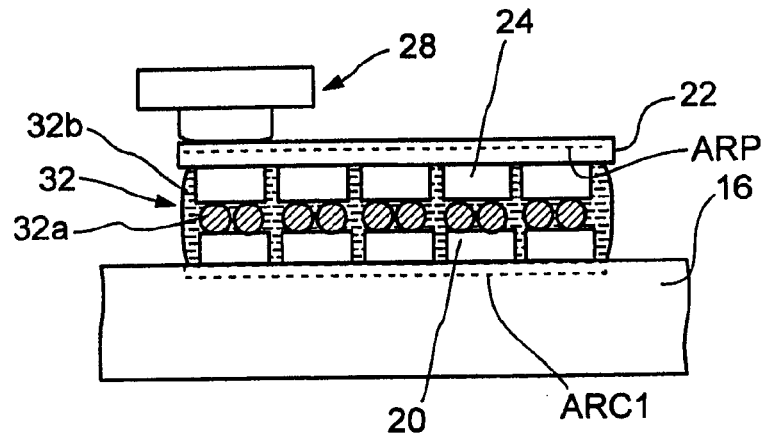

Subsequently, as illustrated in FIG. 9, at the first processing position, the abutting portion 30 is pressed with a specific force (e.g., pressing force of 0.5 to 1.5 Pa) against one end of a pressing region ARP on a surface (i.e., second surface) on the side opposite to the connection region ARC2 of the module substrate 22.

Figure 10:
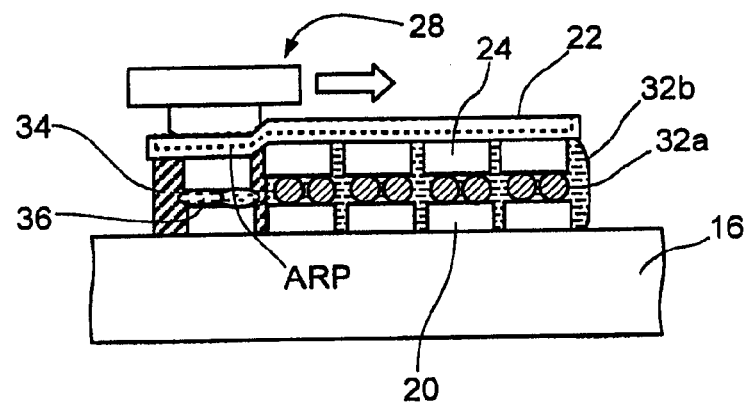

As a result, as illustrated in FIG. 10, the bonding material 32 present below the pressing region ARP corresponding to the first processing position (the left-handed end of the first substrate 22 in the figure) is pressed and heated. The heated solder particles 32a melt, forming molten solder 36. The curing reaction of the uncured resin 32b present around the molten solder 36 proceeds, forming a resin reinforcement portion 34 comprising cured material. The temperature of the molten solder 36 decreases as time passes by, and the molten solder 36 turns into solid solder 38 (see FIG. 11).

Figure 11:
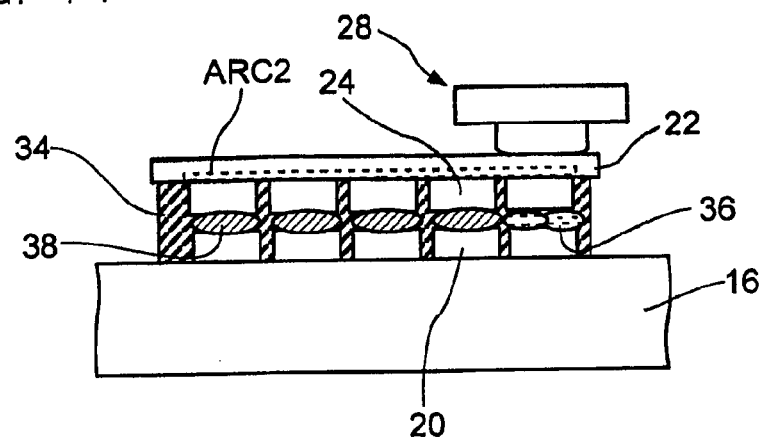

From the state of FIG. 10, the tool head 28 is moved in the direction indicated by the arrow in the figure at a constant speed VT (e.g., 1 mm/sec≤VT≤10 mm/sec). Specifically, the tool head 28 is moved from the first processing position of the first electrode to a processing position of another first electrode that is not yet subjected to the joining process, and then moved to a processing position of still another first electrode that is not yet subjected to the joining process. In that way, the molten solder 36 is formed at those processing positions, and upon passage of a predetermined time, the molten solder 36 turns into the solid solder 38. As a result, as illustrated in FIG. 11, the module electrode 24 within the connection region ARC2 and the corresponding circuit-board electrode 20 are successively joined to each other via the solid solder 38. Simultaneously, the uncured resin 32b in the bonding material 32 cures, successively forming the resin reinforcement portion 34 being a resin portion of the solder joint around the solid solder 38. In that way, the main circuit board 16 and the module substrate 22 of the electronic module 18 are connected to each other.

Figure 12:
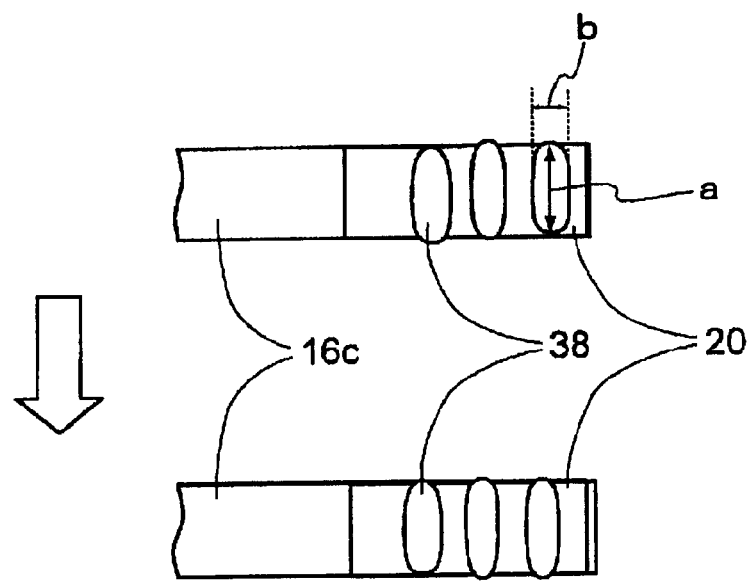

FIG. 12 schematically illustrates the shape of the metal portion (solid solder) in the solder joint formed by the heat pressing as described above. As illustrated in FIG. 12, the solid solder 38 has a shape stretched in the moving direction of the heating tool 26 (the direction indicated by the arrow in the figure). More specifically, the solid solder 38 has a flat shape stretched in the plane direction of the circuit-board electrode 20 being the second electrode and the module electrode 24 being the first electrode. The flat shape becomes oblong with major diameter a intersecting the longitudinal direction of the second electrode 20 at approximately 90°, and minor diameter b orthogonal to major diameter a. The angle formed by the longitudinal direction of the second electrode 20 and major diameter a of the solid solder is preferably an approximate right angle, but may be, for example, 60° or more and 90° or less.

Embodiment 2

Figure 13:
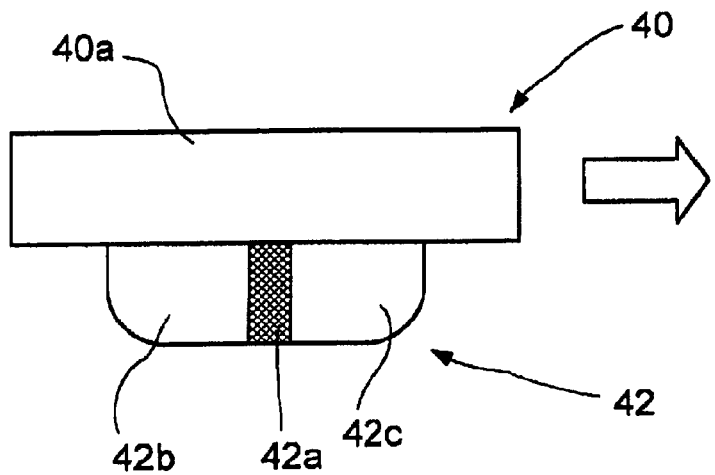

FIG. 13 is a front view of a tool head of the heating tool used in a production system according to another embodiment of the present invention.

A tool head 40 illustrated in the figure, like the tool head 28 of Embodiment 1, includes a base block 40a and an abutting portion 42. The abutting portion 42 of the tool head 40 is divided into a high-temperature portion 42b and a low-temperature portion 42c, via a heat insulator 42a. The material of the heat insulator 42a is not particularly limited, but is, for example, a fibrous heat insulator such as highly heat resistant glass wool, rock wool, cellulose fiber, and carbonized cork, and a foam heat insulator such as phenolic foam. The thickness of the heat insulator 42a is not particularly limited, but is, for example, 1 to 5 mm.

The high-temperature portion 42b is preferably heated to, for example, a temperature similar to that of the abutting portion 30 of Embodiment 1. The low-temperature portion 42c is heated to a predetermined temperature which is, for example, 50° C. or more lower than that of the high-temperature portion 42b, although not limited thereto as long as it is lower than that of the high-temperature portion 42b. The abutting portion 42 may be provided with a chamfered portion like in Embodiment 1. One possible way of partially heating the high-temperature portion 42b only is to embed a heat source such as a filament in the high-temperature portion 42b only. Another possible way is to install a heat source in the heating tool 26, and form a circulation path of a heat medium heated by the heat source, on the side of the high-temperature portion 42b only.

The low-temperature portion 42c is arranged ahead of the high-temperature portion 42b (on the right-handed side in FIG. 13) in the moving direction of the heating tool 26 (the direction indicated by the arrow in the figure). By arranging the low-temperature portion 42c on the forward side of the moving direction of the heating tool 26, the module substrate 22 can be pressed first with the low-temperature portion 42c, and then heated with the high-temperature portion 42a. As a result, even when an acrylic resin which cures very quickly is used as the uncured resin, the solder particles can be heated while sufficient pressing force is applied thereto without obstructed by the curing of the resin, and thus, a joint with sufficient strength can be formed. By using a resin which cures very quickly, the resin reinforcement portion can be formed rapidly, and the productivity can be significantly improved.

Embodiment 3

Figure 14:
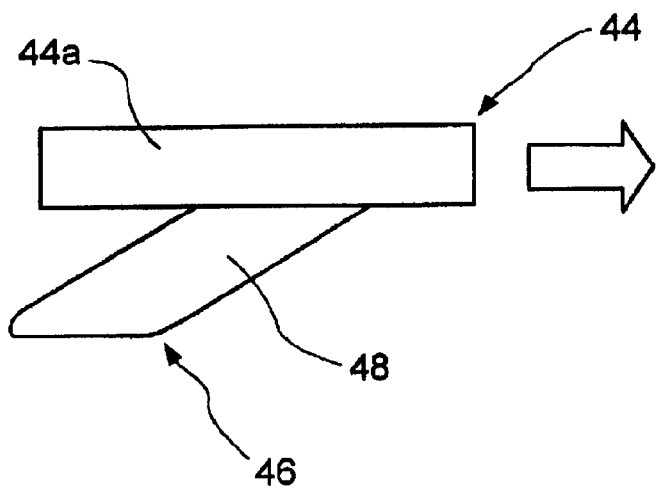

FIG. 14 is a front view of a tool head of the heating tool used in a production system according to yet another embodiment of the present invention.

A tool head 44 illustrated in the figure, like the tool head 28 of Embodiment 1, includes a base block 44a and an abutting portion 46. The abutting portion 46 of the tool head 44 is formed at the tip end (lower end) of an axial member 48 provided in an inclined manner, on the underside of the base block 44a. The axial member 48 is inclined such that the base portion (upper end) thereof is ahead of the tip end (abutting portion 46) in the moving direction of the heating tool 26 (direction indicated by the arrow in the figure). More specifically, the axial member 48 is inclined from a direction normal to the pressing region ARP not yet subjected to the joining process, such that the base portion thereof is on the forward side of the moving direction of the heating tool 26.

By employing the tool head 44 illustrated in the figure, the uncured resin can be heated in advance with the upper end of the axial member 48, before the pressing region ARP is pressed with the abutting portion 46. Therefore, even in the case of using a resin which cures slowly but has good properties after cured (e.g., epoxy resin) as the thermosetting resin, heating of the resin can be started before starting the pressing. In that way, the resin reinforcement portion can be formed more rapidly, and the tool head 28 can be moved at a higher speed. This achieves more reliable connection between the substrates, as well as higher productivity.

Embodiment 4

Figure 15:
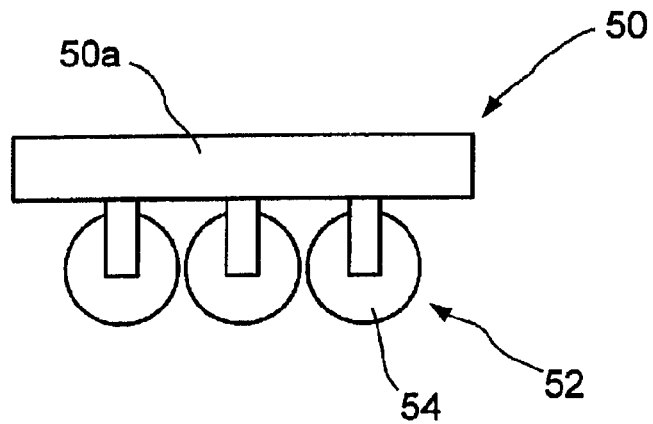

FIG. 15 is a side view of a tool head of the heating tool used in a production system according to yet another embodiment of the present invention.

A tool head 50 illustrated in the figure, like the tool head 28 of Embodiment 1, includes a base block 50a and an abutting portion 52. The abutting portion 52 of the tool head 50 includes one or more rotatable members 54 which are rotatably supported by the base block 50a. The moving direction of the peripheral surfaces of the rotatable members 54 is parallel to that of the heating tool moving along the pressing region of the first substrate.

By employing the tool head 54 illustrated in the figure, the friction between the abutting portion 52 and the pressing region can be effectively reduced, and the heating tool 26 can be moved smoothly.

INDUSTRIAL APPLICABILITY

According to the present invention, when joining a first electrode group on a first substrate to a second electrode group on a second substrate with a bonding material including conducting particles and a thermosetting resin, variations in load are unlikely to occur, and few or no voids are produced in the resin reinforcement portion formed by the cured thermosetting resin. Therefore, a highly reliable connection can be realized between, for example, an electronic module including a flexible substrate and a main circuit board of various electronic equipment. The present invention is particularly useful in producing portable electronic equipment and other electronic equipment for which precision is required.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE SIGNS LIST

1: Circuit board feeder, 2: Bonding material supplying unit, 3: Module feeder, 4: Heat pressing unit, 10: Line, 16: Main circuit board, 18: Electronic module, 20: Circuit-board electrode, 22: Module substrate, 24: Module electrode, 26: Heating tool, 28, 40, 44 and 50: Tool head, 30, 42, 46 and 52: Abutting portion, 32: Bonding material, 32a: Solder particles, 32b: Uncured resin, 34: Resin reinforcement portion, 38: Solder joint, 48: Axial member, 54: Rotatable member, 72: Actuator, 74: Pressing force sensor, 76: Feedback controller, ARC1 and ARC2: Connection region, ARP: Pressing region

The invention claimed is:

1. An electrode joining method comprising the steps of:
   (i) feeding a flexible first substrate having a first surface and a second surface opposite to the first surface, the first surface having a first connection region provided with a first electrode group including a plurality of first electrodes;
   (ii) feeding a second substrate having a second connection region provided with a second electrode group including a plurality of second electrodes corresponding to the plurality of first electrodes;
   (iii) supplying a bonding material to at least one of the first electrode group and the second electrode group, the bonding material including conductive particles and a thermosetting resin;
   (iv) bringing the first electrode group and the second electrode group to face each other via the bonding material, with the first electrode group and the second electrode group aligned with each other; and
   (v) performing a joining process using a heating tool to be abutted against a pressing region on the second surface, the pressing region corresponding to the first connection region,
   the joining process including pressing one or more first electrodes selected from the plurality of first electrodes toward one or more second electrodes corresponding to the one or more first electrodes, and heating the first electrodes and the second electrodes to a temperature at which the thermosetting resin cures,
   the joining process being performed successively, while moving the tool from a processing position of the selected one or more first electrodes to a processing position of another one or more first electrodes that are not yet subjected to the joining process.

2. The electrode joining method according to claim 1, wherein the conductive particles comprise particles of a solder, and the first electrodes and the second electrodes are heated at a temperature higher than or equal to a melting temperature of the solder.

3. The electrode joining method according to claim 1, wherein during the step (v), a pressing force applied by the heating tool to the pressing region is constant.

4. The electrode joining method according to claim 1, wherein during the step (v), the tool is moved at a constant speed.

5. The electrode joining method according to claim 1, wherein the bonding material is a film.

6. A production method of an electrode joined structure, the method comprising the steps of:
   (i) feeding a flexible first substrate having a first surface and a second surface opposite to the first surface, the first surface having a first connection region provided with a first electrode group including a plurality of first electrodes;
   (ii) feeding a second substrate having a second connection region provided with a second electrode group including a plurality of second electrodes corresponding to the plurality of first electrodes;
   (iii) supplying a bonding material to at least one of the first electrode group and the second electrode group, the bonding material including conductive particles and a thermosetting resin;
   (iv) bringing the first electrode group and the second electrode group to face each other via the bonding material, with the first electrode group and the second electrode group aligned with each other; and
   (v) performing a joining process using a heating tool to be abutted against a pressing region on the second surface, the pressing region corresponding to the first connection region,
   the joining process including pressing one or more first electrodes selected from the plurality of first electrodes toward one or more second electrodes corresponding to the one or more first electrodes, and heating the first electrodes and the second electrodes to a temperature at which the thermosetting resin cures,
   the joining process being performed successively, while moving the tool from a processing position of the selected one or more first electrodes to a processing position of another one or more first electrodes that are not yet subjected to the joining process.

7. The production method of an electrode joined structure according to claim 6, wherein the first substrate is included in an electronic module, and the second substrate is included in a motherboard.

8. The production method of an electrode joined structure according to claim 6, wherein the conductive particles comprise particles of a solder, and the first electrodes and the second electrodes are heated at a temperature higher than or equal to a melting temperature of the solder.

* * * * *